United States Patent
Igarashi (10) Patent No.: US 8,772,201 B2
(45) Date of Patent: Jul. 8, 2014

(54) OXIDE SUPERCONDUCTING CONDUCTOR AND METHOD OF MANUFACTURING THE SAME

(71) Applicant: Fujikura Ltd., Tokyo (JP)

(72) Inventor: Mitsunori Igarashi, Sakura (JP)

(73) Assignee: Fujikura Ltd., Tokyo (JP)

(*) Notice: Subject to any disclaimer, the term of this patent is extended or adjusted under 35 U.S.C. 154(b) by 0 days.

(21) Appl. No.: 13/646,077

(22) Filed: Oct. 5, 2012

(65) Prior Publication Data
US 2013/0053251 A1      Feb. 28, 2013

Related U.S. Application Data

(63) Continuation of application No. PCT/JP2011/059802, filed on Apr. 21, 2011.

(30) Foreign Application Priority Data

Apr. 26, 2010    (JP) ................................ 2010-101362

(51) Int. Cl.
    *H01L 39/24*    (2006.01)

(52) U.S. Cl.
    USPC ........... 505/237; 505/125; 505/150; 505/473; 427/62; 174/125.1

(58) Field of Classification Search
    USPC ......... 505/100, 150, 234, 237, 470, 473, 704; 174/125.1; 427/62
    See application file for complete search history.

(56) References Cited

U.S. PATENT DOCUMENTS

2005/0159298 A1    7/2005  Rupich et al.
2008/0176749 A1*   7/2008  Goyal ........................... 505/125

FOREIGN PATENT DOCUMENTS

| CN | 1176950 A | 3/1998 |
| EP | 2234121 A1 | 9/2010 |
| JP | 01-145364 | 6/1989 |
| JP | 01-160826 | 6/1989 |
| JP | 4-2610 A | 1/1992 |
| JP | 2005-116408 A | 4/2005 |
| JP | 2007-526199 A1 | 9/2007 |
| JP | 2008-130291 A | 6/2008 |
| WO | 2009/087720 A1 | 7/2009 |

OTHER PUBLICATIONS

Office Action issued by the Patent Office of the People's Republic of China dated Mar. 11, 2014, and issued in Patent Application No. 201180018194.2.

* cited by examiner

*Primary Examiner* — Stanley Silverman
*Assistant Examiner* — Kallambella Vijayakumar
(74) *Attorney, Agent, or Firm* — Sughrue Mion, PLLC (57) ABSTRACT

An oxide superconducting conductor of the invention is configured to include an oxide superconducting layer including a substrate and an oxide superconductor formed on the substrate. The oxide superconductor being expressed by a composition formula of $RE_1Ba_2Cu_3O_y$, where RE represents a rare earth element and an expression of $6.5<y<7.1$ is satisfied. A normal conduction phase including Ba and a different phase including an alkaline earth metal having an ionic radius smaller than that of Ba are dispersed in the oxide superconducting layer. The normal conduction phase is an oxide including Ba and one selected from a group consisting of Zr, Sn, Hf, Ce, and Ti.

6 Claims, 2 Drawing Sheets

OXIDE SUPERCONDUCTING CONDUCTOR AND METHOD OF MANUFACTURING THE SAME

CROSS REFERENCE TO RELATED APPLICATIONS

This application is a continuation application based on a PCT Patent Application No. PCT/JP2011/059802, filed Apr. 21, 2011, whose priority is claimed on Japanese Patent Application No. 2010-101362, filed Apr. 26, 2010, the entire content of which are hereby incorporated by reference.

BACKGROUND OF THE INVENTION

1. Field of the Invention

The invention relates to an oxide superconducting conductor and a method of manufacturing the same.

2. Description of the Related Art

An RE123-based oxide superconducting conductor is expressed by a composition of $RE_1Ba_2Cu_3O_y$ (RE: a rare earth element, such as Y or Gd, $6.5<y<7.1$), has a critical temperature that is higher than the temperature of liquid nitrogen (77 K), and is expected to be applied to superconducting equipment, such as superconducting devices, transformers, fault current limiters, motors, and magnets.

Generally, a superconductor that is formed using an RE123-based oxide superconductor so as to have favorable crystalline orientation exhibits high critical current characteristics in the absence of a magnetic field.

However, when a magnetic field is applied to a superconductor in a superconducting state and an electric current is applied, a Lorentz force is generated in a quantized magnetic flux that has intruded into the superconductor.

At this time, when the quantized magnetic flux is moved by the Lorentz force, a voltage is generated in the direction of the electric current, and a resistance is caused.

Since the Lorentz force increases as the electric current value increases, and the magnetic field becomes stronger, the resistance increases, and the critical current characteristics degrade.

As a solution for the above problem, it is generally known that nanoscale different phases, such as impurities or defects, are doped into a superconducting layer, and the magnetic flux is pinned, thereby improving the critical current characteristics of the superconductor in a magnetic field.

As such a method, for example, a method in which the amount of a superconducting material substituted with Re and Ba, the substrate temperature during formation of a superconducting layer, and the oxygen partial pressure are controlled so as to control the amount of stacking faults caused in the superconducting layer, thereby introducing fine pinning points in a superconducting laminate (refer to Japanese Unexamined Patent Application, First Publication No. 2005-116408) is proposed.

Alternately, a method in which columnar crystals of a Ba oxide having the perovskite structure, such as $BaZrO_3$, $BaWO_4$, $BaNb_2O_6$, $BaSnO_3$, $BaHfO_3$, or $BaTiO_3$, are introduced and arranged intermittently in the film thickness direction of a superconducting layer in the superconducting layer composed of an RE123-based oxide superconductor is proposed (refer to Japanese Unexamined Patent Application, First Publication No. 2008-130291).

However, an attempt to improve the critical current characteristics in a magnetic field by introducing stacking defects as described in Japanese Unexamined Patent Application, First Publication No. 2005-116408 becomes a principle in which the optimal conditions for formation of a superconducting thin film, which makes a high critical current possible, are intentionally avoided.

Originally, it is necessary to strictly control the conditions for film formation when a superconducting layer is formed.

Therefore, the method in which a superconducting layer is formed by changing the conditions of film formation, such as the oxygen partial pressure and the substrate temperature, as described in Japanese Unexamined Patent Application, First Publication No. 2005-116408 becomes a film-forming method outside the optimal conditions for film formation.

As a result, there are problems in that the critical current characteristics are significantly deteriorated, it becomes difficult to control the amount of defects, and it becomes difficult to manufacture a superconducting wire having uniform critical current characteristics throughout the longitudinal direction thereof.

In addition, in an attempt to improve the critical current characteristics in a magnetic field by introducing columnar crystals into a superconducting layer as described in Japanese Unexamined Patent Application, First Publication No. 2008-130291, it is easy to control the stacking defects, but there is a problem in that the critical current characteristics are degraded in the absence of a magnetic field or in an extremely low magnetic field area.

In addition, since the columnar crystals grow excessively in parallel with the c axis (the film thickness direction of the superconducting layer; the vertical direction to a substrate of the superconducting wire), a strong effect of suppressing the movement of a quantized magnetic flux can be obtained in a case in which a magnetic field is applied in the c-axis direction; however, in a case in which a magnetic field is applied at other angles, such as in the 45° direction with respect to the c axis, the effect of suppressing the movement of the quantized magnetic flux is weak, and thus there is a problem in that the critical current characteristics become somewhat significantly degraded.

SUMMARY OF THE INVENTION

The invention has been made in consideration of the above circumstances, and an object of the invention is to provide an oxide superconducting conductor which suppresses degradation of the critical current density in a magnetic field, and has favorable critical current characteristics, and a method of manufacturing the same.

In order to solve the above-described problems, an oxide superconducting conductor of a first aspect of the invention is configured to include an oxide superconducting layer including a substrate and an oxide superconductor formed on the substrate where the oxide superconductor is expressed by a composition formula of $RE_1Ba_2Cu_3O_y$ where RE represents a rare earth element and an expression of $6.5<y<7.1$ is satisfied.

In the oxide superconducting layer, a normal conduction phase including Ba and a different phase including an alkaline earth metal having the ionic radius smaller than that of Ba are dispersed.

The normal conduction phase is an oxide including Ba and one selected from a group consisting of Zr, Sn, Hf, Ce, and Ti.

In the oxide superconducting conductor of the first aspect of the invention, it is preferable that the alkaline earth metal be Sr or Ca.

In the oxide superconducting conductor of the first aspect of the invention, it is preferable that the normal conduction phase be an oxide including Ba and Zr and the alkaline earth metal be Sr.

In the oxide superconducting conductor of the first aspect of the invention, it is preferable that one selected from the group consisting of Zr, Sn, Hf, Ce, and Ti in the oxide superconducting layer be in a range of 0.01 mass % to 1 mass % with respect to the $RE_1Ba_2Cu_3O_y$, where RE represents a rare earth element and the expression of $6.5<y<7.1$ is satisfied.

In the oxide superconducting conductor of the first aspect of the invention, it is preferable that the alkaline earth metal in the oxide superconducting layer be in a range of 0.01 mass % to 0.25 mass % with respect to the $RE_1Ba_2Cu_3O_y$, where RE represents a rare earth element and the expression of $6.5<y<7.1$ is satisfied.

In the oxide superconducting conductor of the first aspect of the invention, it is preferable that the introduction amount of the alkaline earth metal be less than or equal to 40 mol % with respect to the introduction amount of one selected from the group consisting of Zr, Sn, Hf, Ce, and Ti.

In the oxide superconducting conductor of the first aspect of the invention, it is preferable that an intermediate layer and a cap layer be interposed between the substrate and the oxide superconducting layer in this order, and a stabilizing layer is formed on the oxide superconducting layer.

In order to solve the above-described problems, a method of manufacturing an oxide superconducting conductor of a second aspect of the invention includes: using a target including a constituent element of an oxide superconductor, one selected from a group consisting of Zr, Sn, Hf, Ce, and Ti, and an alkaline earth metal having the ionic radius smaller than that of Ba, the oxide superconductor being expressed by a composition formula of $RE_1Ba_2Cu_3O_y$ where RE represents a rare earth element and an expression of $6.5<y<7.1$ is satisfied; and forming an oxide superconducting layer, in which a normal conduction phase and a different phase are dispersed, on a substrate by physical vapor deposition, the normal conduction phase including Ba and one selected from the group consisting of Zr, Sn, Hf, Ce, and Ti, the different phase including the alkaline earth metal having the ionic radius smaller than that of Ba.

In the method of manufacturing an oxide superconducting conductor of the second aspect of the invention, it is preferable that, as the target, a sintered target be used in which powder of a compound including one selected from the group consisting of Zr, Sn, Hf, Ce, and Ti is doped in a range of 0.1 mol % to 10 mol % with respect to powder including the constituent element of the $RE_1Ba_2Cu_3O_y$, where RE represents a rare earth element and the expression of $6.5<y<7.1$ is satisfied, and powder of a compound including the alkaline earth metal is doped in a range of 0.1 mol % to 2 mol %.

ADVANTAGEOUS EFFECTS OF INVENTION

In the oxide superconducting conductor of the first aspect of the invention, the alkaline earth metal having the ionic radius smaller than that of Ba is introduced into the oxide superconducting layer in addition to one selected from the group consisting of Zr, Sn, Hf, Ce, and Ti.

With regard to columnar crystals that are a normal conduction phase including Ba, there is a tendency of suppressing the growth in the c-axis direction compared to artificial pinning of columnar crystals that are grown by introducing one kind of element in a conventional case.

As a result, in column crystals that are a normal conduction phase including Ba in the invention, crystals in the c-axis direction grow into a favorable length of approximately 10 nm to 100 nm, and the critical current characteristics can be improved in areas at all angles at which a magnetic field is applied.

In addition, in the oxide superconducting conductor of the first aspect of the invention, an alkaline earth metal having the ionic radius smaller than that of Ba is introduced to an oxide superconducting layer.

Consequently, in a $RE_1Ba_2Cu_3O_y$ superconductor having the perovskite structure, it is possible to suppress substitution of RE and Ba and effectively suppress degradation of the critical current characteristics.

In the method of manufacturing an oxide superconducting conductor of the second aspect of the invention, a raw material is used into which the constituent element of the oxide superconductor, one selected from the group consisting of Zr, Sn, Hf, Ce, and Ti, and the alkaline earth metal having the ionic radius smaller than that of Ba are introduced in a desired proportion.

Accordingly, it is possible to conveniently manufacture an oxide superconducting conductor having favorable critical current characteristics.

In addition, it is possible to manufacture an oxide superconducting conductor through a convenient process by physical vapor deposition, such as pulse laser deposition (PLD), using a target including the constituent elements of an oxide superconductor that is expressed by a composition formula of $RE_1Ba_2Cu_3O_y$, one selected from a group consisting of Zr, Sn, Hf, Ce, and Ti, and an alkaline earth metal having the ionic radius smaller than that of Ba, and a conventional film-forming apparatus.

DETAILED DESCRIPTION OF THE PREFERRED EMBODIMENTS

Embodiments of an oxide superconducting conductor and a method of manufacturing the same of the invention will be described. The oxide superconducting conductor of the invention has an oxide superconducting layer composed of a substrate and an oxide superconductor that is expressed by a composition formula of $RE_1Ba_2Cu_3O_y$ (in the formula, RE represents a rare earth element, and an expression of $6.5<y<7.1$ is satisfied) formed on the substrate.

In the oxide superconducting layer, a normal conduction phase including Ba and a different phase including an alkaline earth metal having an ionic radius smaller than that of Ba are dispersed.

The normal conduction phase is an oxide including Ba and one selected from a group consisting of Zr, Sn, Hf, Ce, and Ti.

In addition, the "different phase including an alkaline earth metal having the ionic radius smaller than that of Ba" includes a perovskite compound which combines with oxygen "O" and "$ABO_3$" when the alkaline earth metal is indicated by "A", and elements, such as Zr, Sn, Hf, Ce, and Ti, are indicated by "B".

Figure 1:
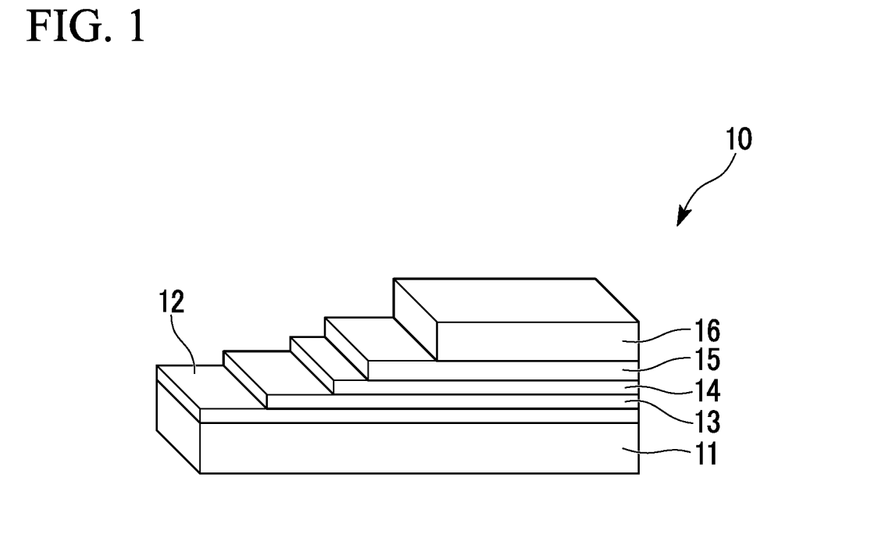
FIG. 1 is a schematic perspective view showing an example of an oxide superconducting conductor according to the invention.

FIG. 1 is a schematic perspective view showing an example of an oxide superconducting conductor according to the invention.

An oxide superconducting conductor 10 as shown in FIG. 1 has a bed layer 12, an intermediate layer 13, a cap layer 14, and an oxide superconducting layer 15 laminated in this order on a substrate 11.

A stabilizing layer 16 is laminated on the oxide superconducting layer 15.

In the oxide superconducting conductor 10, the bed layer 12 may not be provided.

The substrate 11 that can be applied to the oxide superconducting conductor 10 of the embodiment includes substrates that can be used as a substrate for an ordinary superconducting wire or superconducting conductor and have a high strength.

The shape of the substrate 11 is preferably a tape in order to form a long cable.

A material for the substrate 11 is preferably heat-resistant metal.

Examples of the metal includes a variety of metallic materials, for example, silver, platinum, stainless steel, copper, and nickel alloys such as HASTELLOY (trademark of Haynes International, Inc.), materials having ceramics disposed on each of the variety of metallic materials, and the like.

Among the heat-resistant metals, a nickel alloy is preferred.

Among them, as a commercially available product, HASTELLOY is preferred.

As HASTELLOY, any kinds of HASTELLOY B, C, G, N, W, and the like, for which the component amounts of molybdenum, chromium, iron, cobalt, and the like differ, can be used.

The thickness of the substrate 11 may be appropriately adjusted according to purpose, and, ordinarily, is 10 μm to 500 μm.

The bed layer 12 is highly heat-resistant, reduces the interfacial reactivity with the substrate 11, and is used to obtain the orientation of a film that is disposed on the bed layer.

The bed layer 12 is disposed according to necessity, and composed of, for example, yttria ($Y_2O_3$), silicon nitride ($Si_3N_4$), aluminum oxide ($Al_2O_3$, also referred to as "alumina"), and the like.

The bed layer 12 is formed by, for example, a film-forming method, such as the sputtering method, and the thickness of the bed layer 12 is, for example, 10 nm to 200 nm.

In addition, in the invention, the structure of the oxide superconducting conductor 10 is not limited to the structure as shown in FIG. 1, and may be a structure in which a diffusion-preventing layer is interposed between the substrate 11 and the bed layer 12.

The diffusion-preventing layer is a layer formed to prevent the constituent elements of the substrate 11 from diffusing into the oxide superconducting layer 15 through the bed layer 12, and composed of silicon nitride ($Si_3N_4$), aluminum oxide ($Al_2O_3$), an oxide of a rare earth metal, and the like.

The thickness of the diffusion-preventing layer is, for example, 10 nm to 400 nm.

In addition, since the crystallinity is not required, the diffusion-preventing layer may be formed by a film-forming method, such as an ordinary sputtering method.

When other layers, such as the intermediate layer 13, the cap layer 14, the oxide superconducting layer 15, and the like, which will be described below, are formed on the substrate 11, if the layers are given a thermal history as a result of essential heating or an essential thermal treatment, there are cases in which part of the constituent elements of the substrate 11 diffuse into the oxide superconducting layer 15 through the bed layer 12.

Therefore, when the diffusion-preventing layer is interposed between the substrate 11 and the bed layer 12, diffusion of the constituent elements can be suppressed.

Particularly, diffusion of the elements toward the top of the substrate 11 from the substrate 11 can be effectively suppressed by employing a bilateral structure in which the diffusion-preventing layer and the bed layer 12 are laminated.

Examples of the structure in which the diffusion-preventing layer is interposed between the substrate 11 and the bed layer 12 include a structure in which $Al_2O_3$ is used as the diffusion-preventing layer, and $Y_2O_3$ is used as the bed layer 12.

The structure of the intermediate layer 13 may be a single layer structure or a multilayer structure.

A material for the intermediate layer 12 is selected from among biaxially-oriented materials in order to control the crystalline orientation of the oxide superconducting layer 15 laminated on the intermediate layer.

Specific examples of the preferable material for the intermediate layer 13 include metallic oxides, such as $Gd_2Zr_2O_7$, MgO, $ZrO_2$—$Y_2O_3$ (YSZ), $SrTiO_3$, $CeO_2$, $Y_2O_3$, $Al_2O_3$, $Gd_2O_3$, $Zr_2O_3$, $Ho_2O_3$, and $Nd_2O_3$.

The thickness of the intermediate layer 13 may be appropriately adjusted according to purpose, and is, ordinarily, in a range of 0.005 μm to 2 μM.

The intermediate layer 13 can be laminated by a well-known method for forming an oxide thin film, such as physical vapor deposition, such as the sputtering method, vacuum deposition, laser deposition, electron beam deposition, or ion beam assist deposition (hereinafter abbreviated as IBAD); chemical vapor deposition (CVD); dipping-pyrolysis processing (MOD); or thermal spraying.

Particularly, the metallic oxide layer formed by IBAD is preferred since the crystalline orientation is favorable, and an effect of controlling the crystalline orientation of the oxide superconducting layer 15 or the cap layer 14 is favorable.

IBAD refers to a method which irradiates a deposition substrate surface with ion beams at a predetermined angle during deposition of a metallic oxide so as to orient crystal axes.

Generally, an argon (Ar) ion beam is used as the ion beam.

For example, the intermediate layer 13 composed of $Gd_2Zr_2O_7$, MgO, or $ZrO_2$—$Y_2O_3$ (YSZ) is particularly preferred since the value of ΔΦ (FWHM: full width at half maximum), which is an index that indicates the degree of crystalline orientation in IBAD, can be decreased.

The cap layer 14 is preferably a layer formed by undergoing a process in which grains epitaxially grow with respect to the surface of the intermediate layer 13, and then grow in the horizontal direction (a direction in parallel with the surface) (overgrowth), whereby the crystal grains selectively grow in the in-plane direction.

The cap layer 14 can produce a higher degree of in-plane orientation than the intermediate layer 13 composed of the metallic oxide layer.

A material for the cap layer 14 is not particularly limited as long as the above function can be developed, but specific examples of the preferable material include $CeO_2$, $Y_2O_3$, $Al_2O_3$, $Gd_2O_3$, $Zr_2O_3$, $Ho_2O_3$, $Nd_2O_3$, and the like.

In a case in which the material for the cap layer 14 is $CeO_2$, the cap layer 14 may include a Ce-M-O-based oxide in which part of Ce atoms are substituted with other metal atoms or metal ions.

The $CeO_2$ layer can be formed by pulse laser deposition (PLD), the sputtering method, or the like, but it is desirable to use PLD since a high film-forming rate can be obtained.

The conditions for forming the $CeO_2$ layer by PLD include conditions in which the temperature of a substrate is set to approximately 500° C. to 1000° C., the pressure is set to approximately 0.6 Pa to 100 Pa, and oxygen is used as a film-forming gas (gaseous atmosphere).

The thickness of the $CeO_2$ layer is 50 nm or more, but is preferably 100 nm or more, and more preferably 500 nm or more in order to obtain sufficient orientation.

However, when the $CeO_2$ layer is too thick, the crystalline orientation becomes poor, and therefore the thickness is preferably 500 nm to 1000 nm.

As such, when the oxide superconducting layer 15 which will be described below is formed on the cap layer 14 having favorable orientation, the oxide superconducting layer 15 also crystallizes so as to match the orientation of the cap layer 14.

Therefore, the oxide superconducting layer 15 formed on the cap layer 14 has little disarray in the crystalline orientation.

In addition, in each of the crystal grains that compose the oxide superconducting layer 15, the c axis in which it is difficult to apply an electric current in the thickness direction of the substrate 11 is oriented, and a axes or b axes are oriented in the longitudinal direction of the substrate 11.

As a result, the obtained oxide superconducting layer 15 is excellent in terms of the quantum binding properties in crystal grain boundaries, and superconducting characteristics seldom deteriorate in crystal grain boundaries, and therefore it becomes easy to apply an electric current in the longitudinal direction of the substrate 11, and a sufficiently high critical current density can be obtained.

The oxide superconducting layer 15 is composed of an RE123-based oxide superconductor, and, in the oxide superconducting layer 15, a normal conduction phase including Ba and a different phase including an alkaline earth metal having the ionic radius smaller than that of Ba are dispersed.

The RE123-based oxide superconductor is a substance expressed by a composition of $RE_1Ba_2Cu_3O_y$ (in the formula, RE represents a rare earth element, and the expression of $6.5<y<7.1$ is satisfied), and, specifically, RE includes Y, La, Nd, Sm, Er, Gd, and the like.

Among such substances, $Gd_1Ba_2Cu_3O_y$ and $Y_1Ba_2Cu_3O_y$ are preferred, and $Gd_1Ba_2Cu_3O_y$ is more preferred.

The normal conduction phase including Ba, which is dispersed in the oxide superconducting layer 15, functions as an artificial pin that suppresses the movement of a quantized magnetic flux in the oxide superconducting layer 15.

The normal conduction phase including Ba includes oxides including Ba and one selected from the group consisting of Zr, Sn, Hf, Ce, and Ti, and, specifically, includes $BaZrO_3$, $BaSnO_3$, $BaHfO_3$, $BaCeO_3$, or $BaTiO_3$. Among them, $BaZrO_3$ is preferred.

The normal conduction phase forms an oxide together with Ba when any element of Zr, Sn, Hf, Ce, and Ti is introduced to the oxide superconducting layer 15, and grows as a columnar crystal.

Furthermore, in the oxide superconducting layer 15, a different phase including an alkaline earth metal having the ionic radius smaller than that of Ba is dispersed.

Specific examples of the alkaline earth metal having the ionic radius smaller than that of Ba include Sr, Ca, Mg, and Be, and, among them, Sr and Ca are preferred, and Sr is particularly preferred.

The ionic radius of rare earth elements increases as the atomic numbers of light rare earth elements decreases in, for example, the lanthanoids.

Therefore, in a system of $RE_1Ba_2Cu_3O_y$ (RE123-based) oxide superconductors, the ionic radius approximates to that of Ba particularly in a case in which RE is Gd or a rare earth element that is lighter than Gd.

Therefore, in $RE_1Ba_2Cu_3O_y$ having the perovskite structure, there are cases in which substitution of RE and Ba becomes liable to occur.

When substitution of RE and Ba occurs as described above, there are cases in which the critical current characteristics of the superconductor are degraded.

In the invention, it is possible to suppress substitution of RE and Ba in $RE_1Ba_2Cu_3O_y$ having the perovskite structure by introducing an alkaline earth metal having a smaller radius than Ba to the oxide superconducting layer 15.

In addition, in $RE_1Ba_2Cu_3O_y$ (mother phase) having the perovskite structure, there are cases in which the introduced alkaline earth metal occupies positions of Ba, but sites at which the mother phase includes an alkaline earth metal as described above have normal conductivity, and thus function as an artificial pin that suppresses the movement of a quantized magnetic flux.

Hitherto, tetravalent elements, such as Zr, have been used as a substance known as an artificial pin of a quantized magnetic flux in the RE123-based superconducting layer.

In this case, columnar crystals having the perovskite structure, such as $BaZrO_3$, are grown in the c-axis direction (the film thickness direction of the superconducting layer; the perpendicular direction to the substrate) by introducing Zr.

However, with the artificial pin of a conventional columnar crystal to which only Zr was simply introduced as described above, crystals in the c-axis direction grew excessively, and the critical current characteristics became favorable in a magnetic field in the c-axis direction; however, when a magnetic field was applied at an angle deviated from the c axis, such as in the vertical direction with respect to the c axis (the horizontal direction of the superconducting layer; the horizontal direction of the substrate), there was a problem in that the critical current characteristics were degraded.

That is, in a method in which one kind of element is simply introduced as an artificial pin so as to grow columnar crystals, there was a problem in that anisotropy toward a magnetic field was strong.

In the invention, an alkaline earth metal is introduced to the columnar crystals having the perovskite structure, such as $BaZrO_3$, $BaSnO_3$, $BaHfO_3$, $BaCeO_3$, or $BaTiO_3$, by introducing an alkaline earth metal having the ionic radius smaller than that of Ba to the oxide superconducting layer 15 in addition to one selected from the group consisting of Zr, Sn, Hf, Ce, and Ti.

Because of this, in the columnar crystal that has a normal conduction phase including Ba, substitution of Ba and the alkaline earth metal in the columnar crystal, and the like lead to a tendency of suppressing the growth in the c-axis direction compared to the artificial pin of a conventional column crystal which is grown by introducing one kind of element.

As a result, in the normal conduction phase including Ba in the invention, that is, the column crystals having the perovskite structure, such as $BaZrO_3$, $BaSnO_3$, $BaHfO_3$, $BaCeO_3$, or $BaTiO_3$, the crystals in the c-axis direction grow into a favorable length of approximately 10 nm to 100 nm, and the critical current characteristics can be improved in areas at all angles at which a magnetic field is applied.

In addition, the effect of the alkaline earth metal that suppresses substitution of RE and Ba in $RE_1Ba_2Cu_3O_y$ (mother phase) as described above works synergistically, and the critical current characteristics can be further improved.

In the invention, it is particularly preferable that $BaZrO_3$ be introduced as the normal conduction phase including Ba, and Sr be introduced as the alkaline earth metal having the ionic radius smaller than that of Ba to the oxide superconducting layer 15, and, in this case, the critical current characteristics can be improved in areas at all angles at which a magnetic field is applied.

The introduction proportion of one selected from the group consisting of Zr, Sn, Hf, Ce, and Ti in the oxide superconducting layer 15 is preferably in a range of 0.01 mass % to 1 mass % with respect to the mother phase of $RE_1Ba_2Cu_3O_y$.

In addition, the introduction proportion of the alkaline earth metal having the ionic radius smaller than that of Ba in the oxide superconducting layer 15 is preferably in a range of 0.01 mass % to 0.25 mass % with respect to the mother phase of $RE_1Ba_2Cu_3O_y$.

In addition, the sum of the introduction amounts of one selected from the group consisting of Zr, Sn, Hf, Ce, and Ti and the alkaline earth metal having the ionic radius smaller than that of Ba is preferably set to approximately 0.02 mass % to 1.25 mass % with respect to the mother phase of $RE_1Ba_2Cu_3O_y$.

When one selected from the group consisting of Zr, Sn, Hf, Ce, and Ti and the alkaline earth metal having the ionic radius smaller than that of Ba are introduced to the oxide superconducting layer 15 at the above proportions, it is possible to effectively suppress the movement of a quantized magnetic flux so as to suppress degradation of the critical current characteristics in a magnetic field, and to suppress degradation of the critical current characteristics which is caused by substitution of RE and Ba in the mother phase of $RE_1Ba_2Cu_3O_y$.

As a result, it is possible to realize the oxide superconducting conductor 10 having favorable critical current characteristics.

In contrast to the above, in a case in which the introduction proportion of one selected from the group consisting of Zr, Sn, Hf, Ce, and Ti is less than 0.01 mass % with respect to the mother phase of $RE_1Ba_2Cu_3O_y$, or the introduction proportion of the alkaline earth metal having the ionic radius smaller than that of Ba is less than 0.01 mass % with respect to the mother phase of $RE_1Ba_2Cu_3O_y$, there is a possibility that it is difficult to obtain the pinning effect of the introduction of the normal conduction phase including Ba or the effect of suppressing substitution of RE and Ba in the mother phase of $RE_1Ba_2Cu_3O_y$.

In addition, in a case in which the introduction proportion of one selected from the group consisting of Zr, Sn, Hf, Ce, and Ti exceeds 1 mass % with respect to the mother phase of $RE_1Ba_2Cu_3O_y$, or the introduction proportion of the alkaline earth metal having the ionic radius smaller than that of Ba exceeds 0.25 mass % with respect to the mother phase of $RE_1Ba_2Cu_3O_y$, the proportion of the RE123-based oxide superconductor is excessively decreased in the oxide superconducting layer 15, and there is a possibility that the superconducting characteristics of the oxide superconducting conductor 10 will be degraded.

The introduction proportion of the alkaline earth metal having the ionic radius smaller than that of Ba is preferably set to 40 mol % or less with respect to the introduction proportion of one selected from the group consisting of Zr, Sn, Hf, Ce, and Ti.

When the alkaline earth metal having the ionic radius smaller than that of Ba is introduced at the above proportion, the introduction proportions of Ba and the columnar crystals which are an oxide of any of Zr, Sn, Hf, Ce, or Ti, or the length of the columnar crystals grown in the c-axis direction becomes a favorable length of approximately 10 nm to 100 nm.

As a result, in the oxide superconducting conductor of the present embodiment, the critical current characteristics can be improved in areas at all angles at which a magnetic field is applied.

In a method in which the ratio of the composition of the oxide superconducting layer 15 is specified, for example, the composition is specified using analysis data of electron beams, a cross section is observed using a transmission emission microscope (TEM), and the ratios of the different phase (and the normal conduction phase) are obtained, whereby the ratio of the composition of the oxide superconducting layer 15 can be specified.

The thickness of the oxide superconducting layer 15 can be appropriately adjusted according to purpose, but is preferably 0.3 μm to 9 μM, and more preferably 0.5 μm to 5 μm.

In addition, the oxide superconducting layer 15 preferably has a uniform thickness.

In a method in which the oxide superconducting layer 15 is formed, the oxide superconducting layer 15 can be laminated by physical vapor deposition, such as sputtering, vacuum deposition, laser deposition, or electron beam deposition; chemical vapor deposition (CVD); dipping-pyrolysis processing (MOD); or the like.

Among the above methods, pulse laser deposition (PLD), a trifluoroacetate-metal organic deposition (TFA-MOD, an organic metal deposition method in which trifluoroacetate is used, dipping-pyrolysis process), or CVD is preferably used from the viewpoint of productivity.

MOD is a method in which a metallic organic salt is coated, and then thermally decomposed.

More specifically, a solution containing an organic compound having metallic components uniformly dissolved therein is coated on a substrate, and then the solution is heated and thermally decomposed, thereby forming a thin film on the substrate.

Since a vacuum process is not required, and a film can be rapidly formed at a low cost, this method is appropriate for manufacturing a tape-shaped elongated oxide superconducting conductor.

During MOD, the introduction proportion of the normal conduction phase including Ba or the alkaline earth metal having the ionic radius smaller than that of Ba in the formed oxide superconducting layer 15 can be controlled by adjusting the composition of a raw material solution.

During CVD, the introduction proportion of the normal conduction phase including Ba or the alkaline earth metal having the ionic radius smaller than that of Ba in the formed oxide superconducting layer 15 can be controlled by controlling the type or flux of a raw material gas.

During PLD, the introduction proportion of the normal conduction phase including Ba or the alkaline earth metal having the ionic radius smaller than that of Ba in the formed oxide superconducting layer 15 can be controlled by adjusting the composition ratio of a target being used.

In order to form the oxide superconducting layer 15 by the above method, the composition ratio of the raw material is adjusted so that one selected from the group consisting of Zr, Sn, Hf, Ce, or Ti is doped in a range of 0.01 mass % to 1 mass %, and the alkaline earth metal having the ionic radius smaller than that of Ba is doped in a range of 0.01 mass % to 0.25 mass % with respect to $RE_1Ba_2Cu_3O_y$ (RE123-based). Therefore, a thin film (the oxide superconducting layer 15) in which the composition ratio is reflected can be formed.

Specifically, in a case in which a film is formed by pulse laser deposition (PLD), it is preferable to use a target sintered after 0.1 mol % to 10 mol % of one selected from the group consisting of Zr, Sn, Hf, Ce, or Ti is doped, and 0.1 mol % to 2 mol % of powder of a compound including the alkaline earth metal having the ionic radius smaller than that of Ba is doped with respect to powder of $RE_1Ba_2Cu_3O_y$ (RE123-based) or powder including the constituent elements of $RE_1Ba_2Cu_3O_y$ (RE123-based).

When one selected from the group consisting of Zr, Sn, Hf, Ce, or Ti and the alkaline earth metal having the ionic radius smaller than that of Ba are doped in the above ranges by mol % or mass % into the RE123-based oxide superconductor, the normal conduction phase including Ba and the different phase including the alkaline earth are dispersed and formed as described above.

For this reason, the oxide superconducting layer 15, which can effectively suppress the movement of a quantized magnetic flux and effectively suppress substitution of RE and Ba in the RE123-based mother phase, can be formed.

As a result, it is possible to realize the oxide superconducting conductor 10 that suppresses degradation of the critical current in a magnetic field and has favorable critical current characteristics.

In the invention, among the above methods, the oxide superconducting layer 15 can be particularly preferably formed by PLD which is physical vapor deposition.

Hereinafter, as an embodiment of a method of manufacturing an oxide superconducting conductor of the invention, a manufacturing method by PLD will be described.

Figure 2:
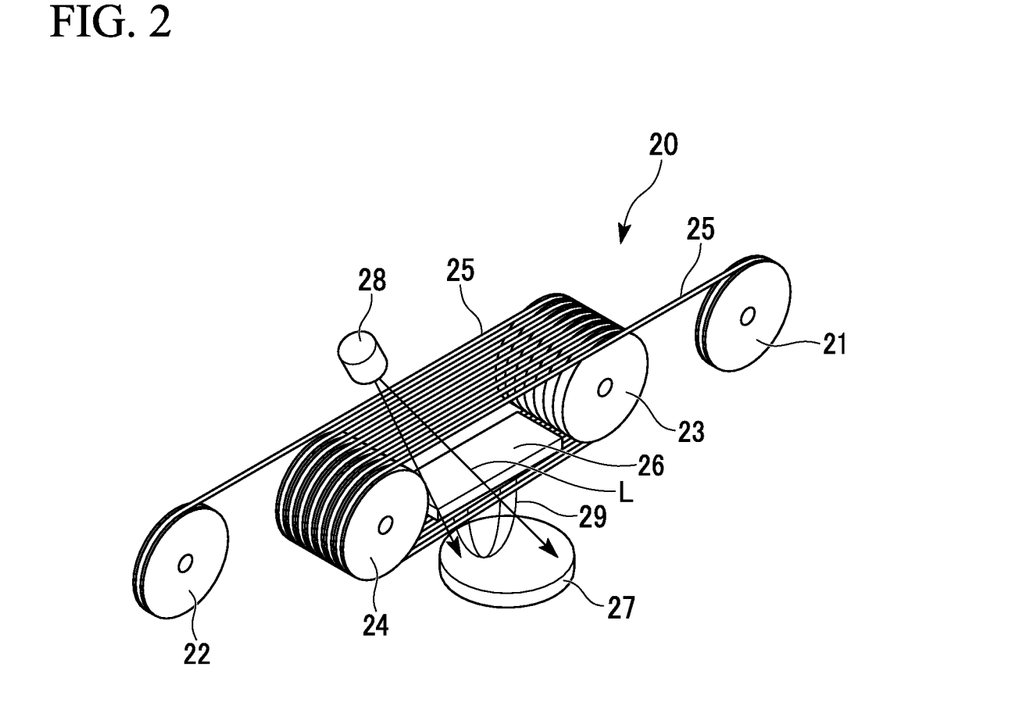
FIG. 2 is a schematic perspective view showing an example of a film-forming apparatus that is used in a method of manufacturing an oxide superconducting conductor of the invention.

FIG. 2 is a schematic perspective view showing an example of a laser deposition apparatus that is used to form an oxide superconducting layer by PLD.

A laser deposition apparatus 20 as shown in FIG. 2 includes a plurality of winding members, such as reels that wind an elongated thin film layered body 25 having the bed layer 12, the intermediate layer 13, and the cap layer 14 sequentially laminated on the substrate 11.

The plurality of winding members are arrayed so that the axial directions of the winding members become substantially in parallel with each other (coaxially arrayed).

More specifically, the laser deposition apparatus 20 has a pair of winding member groups 23 and 24 (a first winding member 23 and a second winding member 24), a delivery reel 21, a winding reel 22, a substrate holder 26, a heating apparatus (not shown), a target 27, and a laser light-emitting apparatus 28.

The pair of winding member groups 23 and 24 are disposed opposite to each other with a gap therebetween.

The delivery reel 21 delivers the thin film layered body 25 which is disposed outside the first winding member group 23.

The winding reel 22 winds the thin film layered body 25 which is disposed outside the second winding member group 24.

The substrate holder supports the thin film layered body 25 that is made to form a plurality of lanes by winding of the winding member groups 23 and 24.

The heating apparatus heats the thin film layered body 25 which is embedded in the substrate holder 26.

The target 27 is disposed opposite to the thin film layered body 25.

The laser light-emitting apparatus 28 irradiates the target 27 with a laser light L.

Since the pair of winding member groups 23 and 24, the delivery reel 21, and the winding reel 22 are driven in synchronization with each other by a driving apparatus (not shown), the thin film layered body 25 delivered from the delivery reel 21 is circulated through the pair of winding member groups 23 and 24, and wound in the winding reel 22.

The elongated thin film layered body 25 wound in the pair of winding member groups 23 and 24 is circulated through the winding member groups 23 and 24, and disposed so as to compose a plurality of lanes in a deposition particle-deposited area.

Therefore, in the laser deposition apparatus 20 of the embodiment, when the surface of the target 27 is irradiated with the laser light L, a jet flow (hereinafter denoted as the plume 29) of deposition particles that are stricken out or evaporated from the target 27 is generated, and deposition particles can be deposited toward the surface of the thin film layered body 25 that runs through an area opposite to the target 27.

The target 27 is made of a plate material, such as a sintered article obtained by feeding a compound including one selected from the group consisting of Zr, Sn, Hf, Ce, and Ti and a compound including the alkaline earth metal having the ionic radius smaller than that of Ba into a complex oxide or an oxide superconductor having a composition that is similar or close to that of the oxide superconducting layer 15 to be formed or including a large amount of components that are easily removed while the film is formed in a desired proportion.

In a process of forming the oxide superconducting layer 15 in the oxide superconducting conductor 10 of the invention, a sintered article or the like, which will be described below, is preferably used as the target 27.

Specifically, a sintered article or the like formed by feeding 0.1 mol % to 10 mol % of powder of a compound including one selected from the group consisting of Zr, Sn, Hf, Ce, or Ti is doped, and 0.1 mol % to 2 mol % of powder of a compound including the alkaline earth metal having the ionic radius smaller than that of Ba with respect to powder of $RE_1Ba_2Cu_3O_y$ (RE123-based) or powder including the constituent elements of $RE_1Ba_2Cu_3O_y$ (RE123-based), and sintering the mixture is preferably used as the target 27.

Furthermore, specifically, for example, in a case in which the oxide superconducting layer 15 in which the normal conduction phase of $BaZrO_3$ and the different phase including Sr are dispersed is formed, a target sintered after 0.1 mol % to 10 mol % of $ZrO_2$ and 0.1 mol % to 2 mol % of SrO are doped with respect to powder of $RE_1Ba_2Cu_3O_y$ (RE123-based) can be used.

Here, the total feeding amount of the compound including one selected from the group consisting of Zr, Sn, Hf, Ce, or Ti, and the compound including the alkaline earth metal having the ionic radius smaller than that of Ba is preferably set to 12 mol % or less with respect to $RE_1Ba_2Cu_3O_y$ (RE123-based).

When the total feeding amount of the compounds exceeds 12 mol %, there is a possibility that the proportion of the RE123-based oxide superconductor in the oxide superconducting layer 15 will become excessively small, and the superconducting characteristics of the oxide superconductor 10 will be degraded.

The feeding amount of the alkaline earth metal having the ionic radius smaller than that of Ba is preferably set to 40 mol % or less of the feeding amount of one selected from the group consisting of Zr, Sn, Hf, Ce, or Ti.

When the alkaline earth metal having the ionic radius smaller than that of Ba is doped into the target 27 at the above proportion, the introduction proportions of Ba and the columnar crystals, which are an oxide of any of Zr, Sn, Hf, Ce, or Ti, or the length of crystals grown in the c-axis direction becomes a favorable length of approximately 10 nm to 100 nm, and the critical current characteristics can be improved in areas at all angles at which a magnetic field is applied.

When a sintered article formed by feeding the compound including one selected from the group consisting of Zr, Sn, Hf, Ce, or Ti, and the compound including the alkaline earth metal having the ionic radius smaller than that of Ba with respect to powder of $RE_1Ba_2Cu_3O_y$ (RE123-based) or powder including the constituent elements of $RE_1Ba_2Cu_3O_y$ (RE123-based) at the above proportions is used as the target 27, the one selected from the group consisting of Zr, Sn, Hf, Ce, or Ti, and the alkaline earth metal having the ionic radius smaller than that of Ba are introduced and dispersed in the RE123-based oxide superconducting layer 15 in ranges of 0.01 mass % to 1 mass % and 0.01 mass % to 0.25 mass % respectively.

As a result, the normal conduction phase including Ba and the different phase including the alkaline earth metal are dispersed and formed, the movement of a quantized magnetic flux is effectively suppressed, substitution of RE and Ba in the RE123-based mother phase is effectively suppressed so as to suppress degradation of the critical current in a magnetic field, and the oxide superconducting conductor 10 having favorable critical current characteristics can be realized.

As the laser light-emitting apparatus 28 irradiating the target 27 with a laser light, an apparatus irradiating the target with a laser light, for example, an excimer laser such as Ar—F (193 nm) and Kr—F (248 nm), a YAG laser, or a $CO_2$ layer, may be used as long as the apparatus generates the laser light L that can sputter deposition particles from the target 27.

Next, a method of forming the oxide superconducting layer 15 on the elongated thin film layered body 25 (on the top surface of the cap layer 14 on the substrate 11) using the laser deposition apparatus 20 having the configuration as shown in FIG. 2 will be described.

Firstly, the target 27 is located at a predetermined position, and then the thin film layered body 25 wound in the delivery reel 21 is drawn and sequentially wound in the pair of winding member groups 23 and 24.

After that, the front end side of the thin film layered body 25 is windably mounted on the winding reel 22.

Therefore, the thin film layered body 25 wound in the pair of winding member groups 23 and 24 is circulated through the pair of winding member groups 23 and 24, and arrayed in a plurality of lines at a position opposite to the target 27 so as to be movable.

After that, an exhaust apparatus (not shown) is driven, and the inside of a treatment vessel (not shown) that is installed so as to cover at least the thin film layered body 25 running between the pair of winding member groups 23 and 24 is depressurized.

At this time, oxygen gas may be introduced to the treatment vessel according to necessity so as to form an oxygen atmosphere in the vessel.

Next, at an appropriate timing before film formation begins by irradiating the target 27 with the laser light L, at least the thin film layered body 25 running through a film-forming area is heated by making an electric current flow through the heating apparatus (not shown), and then the thin film layered body is maintained at a constant temperature.

The surface temperature of the thin film layered body 25 during film formation can be appropriately adjusted, and can be set to, for example, 780° C. to 850° C.

Subsequently, the thin film layered body 25 is delivered from the delivery reel 21, and laser light L is generated from the laser light-emitting apparatus 28 so as to irradiate the target 27 with the laser light L.

At this time, it is preferable that the target 27 be irradiated with the laser light L while scanning the target 27 so as to move the position which is irradiated with the laser light L on the surface of the target 27.

In addition, it is also preferable to use a target-moving mechanism (not shown) to move the target 27 along the parallel surface of the mechanism.

As described above, a plume 29 is generated sequentially from the entire surface area of the target 27 by moving the position which is irradiated with the laser light L on the target 27, and particles in the target 27 are stricken out, or particles in the target 27 are evaporated.

Therefore, the oxide superconducting layer 15 that is as uniform as possible can be formed in each of a plurality of lines of the thin film layered body 25 that is arrayed linearly.

Deposition particles stricken out or evaporated from the target 27 generate the plume 29 having a shape whose cross section in the radiation direction enlarges gradually (refer to FIG. 2), and the deposition particles are deposited on the surface of the thin film layered body 25 moving in a plurality of arrays.

Therefore, while the thin film layered body 25 is circulated through the pair of winding member groups 23 and 24, the oxide superconducting layer 15 is repeatedly formed, and the oxide superconducting layer 15 is deposited on the thin film layered body 25 so as to obtain the necessary thickness.

After the formation of the oxide superconducting layer 15, the obtained oxide superconducting conductor 10 is wound in the winding reel 21.

Through the above processes, the oxide superconducting layer 15 having the normal conduction phase including Ba and the different phase including the alkaline earth metal having the ionic radius smaller than that of Ba dispersed on the thin film layered body 25 (the top surface of the cap layer 14 of the substrate 11) can be formed.

The stabilizing layer 16 as shown in FIG. 1 is preferably deposited on the oxide superconducting layer 15.

The stabilizing layer 16 deposited on the oxide superconducting layer 15 functions as a bypass for an electric current at which an electric current flowing through the oxide superconducting layer 15 commutates in a case in which a partial area of the oxide superconducting layer 15 is about to be transformed into a normal conduction state.

Provision of the stabilizing layer 16 in the above manner stabilizes the superconducting state of the oxide superconducting layer 15, and prevents the loss of the oxide superconducting layer 15.

As a material for the stabilizing layer 16, a material composed of metal having favorable conductivity is preferably employed, and specific examples include materials composed of silver, a silver alloy, copper, or the like.

The structure of the stabilizing layer 16 may be a single structure or a lamellar structure of two or more layers.

A well-known method is used as a method of laminating the stabilizing layer 16, and a method in which a silver layer is formed through plating or by the sputtering method, and a copper tape or the like is adhered on the silver layer, or the like can be employed.

The thickness of the stabilizing layer 16 can be in a range of 3 μm to 300 μm.

A superconducting wire can be obtained by coating the outer circumferential surface of the oxide superconducting conductor 10 having the above configuration with an insulating layer.

The insulating layer is made of a well-known material, such as a variety of ordinarily used resins or the like.

Specific examples of the resin include a polyimide resin, a polyamide resin, an epoxy resin, an acryl resin, a phenol resin, a melamine resin, a polyester resin, a silicon resin, an alkyd resin, a vinyl resin, and the like.

The thickness of the coated insulating layer is not particularly limited, and can be appropriately adjusted depending on the portion in the coating target, and the like.

The insulating layer may be formed by a well-known method depending on the material of the insulating material, and, for example, a raw material may be coated and cured.

In addition, in a case in which a sheet-shaped insulating layer can be procured, the oxide superconducting conductor 10 may be coated with the above insulating layer.

In the oxide superconducting conductor 10 of the invention, occurrence of substitution of RE and Ba in the $RE_1Ba_2Cu_3O_y$ superconductor having the perovskite structure is suppressed by introducing the alkaline earth metal having the ionic radius smaller than that of Ba in the oxide superconducting layer 15.

Thus, degradation of the critical current characteristics can be effectively suppressed.

In addition, the oxide superconducting conductor 10 of the invention has a configuration in which not only one selected from the group consisting of Zr, Sn, Hf, Ce, and Ti but also the alkaline earth metal having the ionic radius smaller than that of Ba are added to the oxide superconducting layer 15.

Consequently, in the columnar crystal which is a normal conduction phase including Ba, such as $BaZrO_3$, $BaSnO_3$, $BaHfO_3$, $BaCeO_3$, or $BaTiO_3$, there is a tendency of suppressing the growth in the c-axis direction compared to artificial pinning of columnar crystals that are grown by introducing one type of element as a conventional case.

As a result, in the normal conduction phase including Ba in the invention, such as the column crystal having the perovskite structure, such as $BaZrO_3$, $BaSnO_3$, $BaHfO_3$, $BaCeO_3$, or $BaTiO_3$, crystals in the c-axis direction grow into a favorable length of approximately 10 nm to 100 nm, and the critical current characteristics can be improved in areas at all angles at which a magnetic field is applied.

In addition, the effect of the alkaline earth metal that suppresses substitution of RE and Ba in $RE_1Ba_2Cu_3O_y$ (mother phase) as described above works synergistically, and the critical current characteristics can be further improved.

Furthermore, according to the method of manufacturing the oxide superconducting conductor of the invention, since a raw material in which the constituent elements of an oxide superconductor, one selected from the group consisting of Zr, Sn, Hf, Ce, and Ti, and the alkaline earth metal having the ionic radius smaller than that of Ba are doped in desired proportions is used, an oxide superconducting conductor having favorable critical current characteristics can be conveniently manufactured.

In addition, it is possible to manufacture an oxide superconducting conductor through a convenient process by pulse laser deposition (PLD), which is physical vapor deposition, using a target including the constituent elements of an oxide superconductor that is expressed by a composition formula of $RE_1Ba_2Cu_3O_y$, one selected from the group consisting of Zr, Sn, Hf, Ce, and Ti, and an alkaline earth metal having the ionic radius smaller than that of Ba, and a conventional film-forming apparatus.

Thus far, the embodiments of the oxide superconducting conductor and the method of manufacturing the oxide superconducting conductor have been described; however, in the above embodiments, the parts of the oxide superconducting conductor, the method of manufacturing the oxide superconducting wire, and the apparatus in which the oxide superconducting wire is used are examples, and can be appropriately modified within the scope of the invention.

Hereinafter, the invention will be described in more detail showing examples, but the invention is not limited to the examples.

EXAMPLE 1

An $Al_2O_3$ film (the diffusion-preventing layer; film thickness 150 nm) was formed on a 5 mm-wide and 0.1 mm-thick tape-shaped HASTELLOY C276 (trademark of Haynes International, Inc.) substrate by the sputtering method.

Next, an $Y_2O_3$ film (the bed layer; film thickness 20 nm) was formed on the diffusion-preventing layer by the ion beam sputtering method.

Next, MgO (the intermediate layer; film thickness 10 nm) was formed on the bed layer by ion beam assisted deposition (IBAD).

Next, a $CeO_2$ film (the cap layer; film thickness 500 nm) was formed on the intermediate layer by pulse laser deposition (PLD).

Next, a 1.0 μm-thick RE123-based oxide superconducting layer was formed on the $CeO_2$ film by pulse laser deposition (PLD) using the laser deposition apparatus 20 as shown in FIG. 2, and, furthermore, a 10 μm-thick Ag (the stabilizing layer) was sputtered on the oxide superconducting layer, thereby manufacturing an oxide superconducting conductor.

Particularly, the oxide superconducting layer was formed using a target obtained by sintering powder containing 1 mol % of SrO and 5 mol % of $ZrO_2$ doped into powder of $GdBa_2Cu_3O_y$ (GdBCO) at a temperature of 800° C., a pressure of 80 Pa, and a laser output of 180 W under an atmosphere of 80% oxygen.

COMPARATIVE EXAMPLE 1

An oxide superconducting conductor was manufactured in the same manner as in Example 1 except that an oxide superconducting layer was formed using a sintered article of $GdBa_2Cu_3O_y$ as a target.

COMPARATIVE EXAMPLE 2

An oxide superconducting conductor was manufactured in the same manner as in Example 1 except that an oxide superconducting layer was formed using a sintered article obtained by sintering powder containing 5 mol % of $ZrO_2$ doped into powder of $GdBa_2Cu_3O_y$ as a target.

COMPARATIVE EXAMPLE 3

An oxide superconducting conductor was manufactured in the same manner as in Example 1 except that an oxide superconducting layer was formed using a sintered article obtained by sintering powder containing 5 mol % of SrO doped into powder of $GdBa_2Cu_3O_y$ as a target.

With regard to the oxide superconducting conductors of Example 1 and Comparative Examples 1 and 2, the critical current densities Jc ($MAcm^{-2}$) were measured at the temperature of liquid nitrogen (77 K) under a magnetic field of 3 T.

Figure 3:
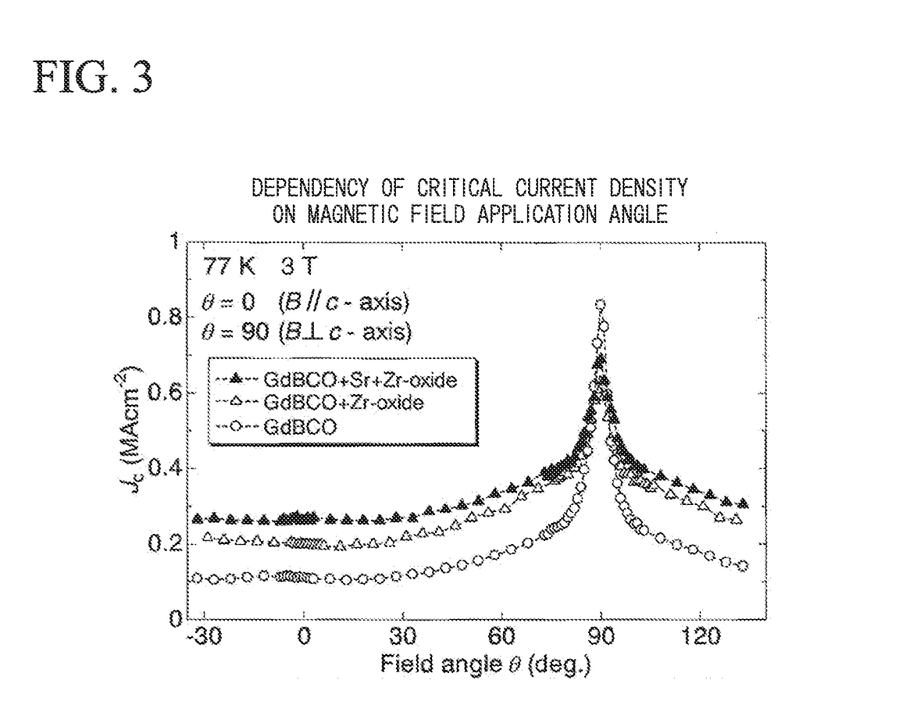
FIG. 3 is a graph showing the dependency of critical current densities on magnetic field application angles.

FIG. 3 shows the results obtained by plotting the dependency of the critical current densities on magnetic field application angles with regard to the oxide superconducting conductors of Example 1 and Comparative Examples 1 and 2.

Specifically, in FIG. 3, "GdBCO+Sr+Zr-oxide" represents Example 1, "GdBCO" represents Comparative Example 1, and "GdBCO+Zr-oxide" represents Comparative Example 2 respectively.

In addition, as a result of measuring the critical current density Jc of the oxide superconducting conductor of Comparative Example 3 when a magnetic field of 3 T was applied at θ=0° (a direction in parallel with the c-axis; the vertical direction to the substrate) and the temperature of liquid nitrogen (77 K), Jc<0.1 MAcm$^{-2}$, and the critical current characteristics were lower than in Comparative Example 1.

The results of FIG. 3 show that the oxide superconducting conductor of the example in which Zr and Sr were introduced to GdBa$_2$Cu$_3$O$_y$, which is an RE123-based oxide superconductor, could suppress degradation of the critical current density compared to the oxide superconducting conductors of Comparative Examples 1 and 2 not only in a case in which the magnetic field application angle was in parallel with the c axis (θ=0° but also in a case in which a magnetic field was applied at an angle deviated from the c axis (0°<θ<90°, particularly at angles near θ=45°.

Therefore, it is evident that the oxide superconducting conductor of the example suppressed degradation of the critical current density in a magnetic field and had favorable critical current characteristics.

EXAMPLE 2

Studies of the Feeding Amounts of Zro$_2$ and Sro

Sample oxide superconducting conductors 1 to 9 were manufactured in the same manner as in Example 1 except that oxide superconducting layers were formed using a sintered article obtained by sintering powder containing ZrO$_2$ and SrO doped into powder of GdBa$_2$Cu$_3$O$_y$ at the feeding amounts as described in Table 1 as a target.

With regard to the obtained sample oxide superconducting conductors 1 to 9, the critical current densities Jc were measured at the temperature of liquid nitrogen (77 K) under a magnetic field of 3 T when the magnetic field was applied at θ=0° (a direction in parallel with the c axis; the vertical direction to the substrate).

The results are shown in Table 1.

TABLE 1

| | Feeding amount of ZrO$_2$ (mol %) | Feeding amount of SrO (mol %) | Total feeding amount (mol %) | Feeding ratio of SrO/ZrO$_2$ (molar ratio) | Jc at θ = 0° (MAcm$^{-2}$) |
|---|---|---|---|---|---|
| Sample 1 | 0 | 0 | 0 | — | 0.1 |
| Sample 2 | 0 | 5.0 | 5.0 | — | <0.1 |
| Sample 3 | 5.0 | 0 | 5.0 | — | 0.20 |
| Sample 4 | 5.0 | 0.1 | 5.1 | 2% | 0.24 |
| Sample 5 | 5.0 | 1.0 | 6.0 | 20% | 0.28 |
| Sample 6 | 5.0 | 2.0 | 7.0 | 40% | 0.26 |
| Sample 7 | 5.0 | 3.0 | 8.0 | 60% | 0.15 |
| Sample 8 | 10.0 | 2.0 | 12.0 | 20% | 0.22 |
| Sample 9 | 11.0 | 2.0 | 13.0 | 18% | 0.16 |

It was confirmed from the results as shown in Table 1 that the samples 4 to 8 for which the sintered article obtained by sintering powder containing ZrO$_2$ and SrO doped into powder of GdBa$_2$Cu$_3$O$_y$ at a total feeding amount of 12 mol % or less was used as a target could effectively suppress degradation of the critical current density.

In addition, it was confirmed that, in a case in which amount of SrO doped into the powder of GdBa$_2$Cu$_3$O$_y$ is 40% or less by the molar ratio with respect to the feeding amount of ZrO$_2$ (Samples 4 to 6 and 8), degradation of the critical current density is effectively suppressed.

INDUSTRIAL APPLICABILITY

According to the oxide superconducting conductor of the invention, the critical current characteristics can be improved in areas at all angles at which a magnetic field is applied.

What is claimed is:

1. An oxide superconducting conductor comprising:
    an oxide superconducting layer comprising a substrate and an oxide superconductor formed on the substrate, the oxide superconductor being expressed by a composition formula of RE$_1$Ba$_2$Cu$_3$O$_y$, where RE represents a rare earth element and an expression of 6.5<y <7.1 is satisfied, wherein
    a normal conduction phase including Ba and a different phase including an alkaline earth metal having an ionic radius smaller than that of Ba are dispersed in the oxide superconducting layer,
    the normal conduction phase is an oxide including Ba and one selected from a group consisting of Zr, Sn, Hf, Ce, and Ti,
    the one selected from the group consisting of Zr, Sn, Hf, Ce, and Ti in the oxide superconducting layer is in a range of 0.01 mass % to 1 mass % with respect to the RE$_1$Ba$_2$Cu$_3$O$_y$,
    the alkaline earth metal in the oxide superconducting layer is in a range of 0.01 mass % to 0.25 mass % with respect to the RE$_1$Ba$_2$Cu$_3$O$_y$, and
    an introduction amount of the alkaline earth metal is less than or equal to 40 mol % with respect to an introduction amount of the one selected from the group consisting of Zr, Sn, Hf, Ce, and Ti.

2. The oxide superconducting conductor according to claim 1, wherein
    the alkaline earth metal is Sr or Ca.

3. The oxide superconducting conductor according to claim 1, wherein
    the normal conduction phase is an oxide including Ba and Zr, and
    the alkaline earth metal is Sr.

4. The oxide superconducting conductor according to claim 1, wherein
    an intermediate layer and a cap layer are interposed between the substrate and the oxide superconducting layer in this order, and a stabilizing layer are formed on the oxide superconducting layer.

5. A method of manufacturing an oxide superconducting conductor, comprising:
    using a target including a constituent element of an oxide superconductor, one selected from a group consisting of Zr, Sn, Hf, Ce, and Ti, and an alkaline earth metal having an ionic radius smaller than that of Ba, the oxide superconductor being expressed by a composition formula of RE$_1$Ba$_2$Cu$_3$O$_y$, where RE represents a rare earth element and an expression of 6.5<y <7.1 is satisfied; and
    forming an oxide superconducting layer, in which a normal conduction phase and a different phase are dispersed, on a substrate by physical vapor deposition, the normal conduction phase including Ba and one selected from the group consisting of Zr, Sn, Hf, Ce, and Ti, the one selected from the group consisting of Zr, Sn, Hf, Ce, and Ti in the oxide superconducting layer being in a range of 0.01 mass % to 1 mass % with respect to the RE$_1$Ba$_2$Cu$_3$O$_y$, the different phase including the alkaline earth metal having an ionic radius smaller than that of Ba, the alkaline earth metal in the oxide superconducting layer being in a range of 0.01 mass % to 0.25 mass % with respect to the RE$_1$Ba$_2$Cu$_3$O$_y$, an introduction amount of the alkaline earth metal being less than or equal to 40 mol % with respect to an introduction amount of the one selected from the group consisting of Zr, Sn, Hf, Ce, and Ti.

6. The method according to claim 5, wherein as the target, a sintered target is used in which powder of a compound including the one selected from the group consisting of Zr, Sn, Hf, Ce, and Ti is doped in a range of 0.1 mol % to 10 mol % with respect to powder including the constituent element of the $RE_1Ba_2Cu_3O_y$, where RE represents a rare earth element and the expression of $6.5<y<7.1$ is satisfied, and powder of a compound including the alkaline earth metal is doped in a range of 0.1 mol % to 2 mol %.

* * * * *